(12) United States Patent
Lee et al.

(10) Patent No.: US 11,271,191 B2
(45) Date of Patent: Mar. 8, 2022

(54) DISPLAY DEVICE INCLUDING A HEAT DISSIPATION MEMBER

(71) Applicant: Samsung Display Co., LTD., Yongin-si (KR)

(72) Inventors: Kang-Woo Lee, Seoul (KR); Sun Hee Oh, Seoul (KR); Boo-Kan Ki, Yongin-si (KR); Dong Hyeon Lee, Seoul (KR); Jeong In Lee, Jeollanam-do (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/845,417

(22) Filed: Apr. 10, 2020

(65) Prior Publication Data

US 2021/0036257 A1    Feb. 4, 2021

(30) Foreign Application Priority Data

Aug. 2, 2019   (KR) .......................... 10-2019-0094409

(51) Int. Cl.
*H01L 51/52*    (2006.01)
*F28F 21/02*    (2006.01)

(52) U.S. Cl.
CPC ............ *H01L 51/529* (2013.01); *F28F 21/02* (2013.01); *H01L 51/5246* (2013.01)

(58) Field of Classification Search
None
See application file for complete search history.

(56) References Cited

U.S. PATENT DOCUMENTS

| 7,956,979 | B2 * | 6/2011 | Oh ..................... G02F 1/133385 |
| | | | 349/161 |
| 2014/0218617 | A1 * | 8/2014 | Hongo ................. G02B 6/0085 |
| | | | 348/725 |
| 2016/0066440 | A1 * | 3/2016 | Choi ..................... G06F 1/1656 |
| | | | 361/679.3 |
| 2016/0268523 | A1 * | 9/2016 | Kim ...................... H01L 51/529 |
| 2018/0146579 | A1 * | 5/2018 | Kim ................... H05K 7/20445 |
| 2018/0366685 | A1 * | 12/2018 | Park ..................... H01L 51/0096 |
| 2019/0058150 | A1 * | 2/2019 | Lee ........................ H01L 51/529 |
| 2019/0130796 | A1 * | 5/2019 | Kang ................. H05K 7/20963 |
| 2019/0272407 | A1 * | 9/2019 | Park ...................... H01L 27/3234 |
| 2021/0034121 | A1 * | 2/2021 | Lee ......................... G06F 1/203 |

FOREIGN PATENT DOCUMENTS

| KR | 1020150005075 A | 1/2015 |
| KR | 10-1859723 B1 | 5/2018 |
| KR | 1020180058156 A | 5/2018 |
| KR | 10-1890451 B1 | 8/2018 |
| KR | 1020180138235 A | 12/2018 |
| KR | 1020190020255 A | 2/2019 |

* cited by examiner

*Primary Examiner* — Ryan Crockett
(74) *Attorney, Agent, or Firm* — Cantor Colburn LLP

(57) ABSTRACT

A display device includes: a display panel including a flat area and a bended area which extends bent from the flat area; and a cover panel comprises a heat dissipation member. The heat dissipation member includes: a flat portion corresponding to the flat area of the display panel, a bent portion corresponding to the bended area of the display panel, a first opening in the flat portion, and a second opening in the bent portion.

20 Claims, 15 Drawing Sheets

DISPLAY DEVICE INCLUDING A HEAT DISSIPATION MEMBER

This application claims priority to and the benefit of Korean Patent Application No. 10-2019-0094409 filed on Aug. 2, 2019, and all the benefits accruing therefrom under 35 U.S.C. § 119, the entire contents of which are incorporated herein by reference.

BACKGROUND

(a) Field

This disclosure relates to a display device.

(b) Description of the Related Art

A display device includes several elements, such as a display panel, a driving circuit, and the like, that operate by responding to an electrical signal. The elements may cause heat generation to essentially function as a heat source. The display device may include a heat dissipation member that radiates and transfers the heat generated from such a heat source.

During or after a manufacturing process of the display device, a rework process may be performed to remove a defective element or part and replace such defective element or part with a non-defective element or part.

SUMMARY

Embodiments improve heat dissipation within of a display device, and reduce or effectively prevent damage to the heat dissipation member during a manufacturing process or a rework process of the display device.

A display device according to an embodiment includes: a display panel including a flat area and a bended area which extends bent from the flat area; and a cover panel includes a heat dissipation member. The heat dissipation member includes: a flat portion corresponding to the flat area of the display panel, a bent portion corresponding to the bended area of the display panel, a first opening in the flat portion, and a second opening in the bent portion.

The heat dissipation member may include graphite.

The first opening may have a shape of a rectangle having a long side and a short side.

The long side of the first opening may be perpendicular to a long side of the display panel.

The cover panel may include a flat area corresponding to the flat area of the display panel, and a first bended area and a second bended area at opposing sides of the flat area of the cover panel, and a length L of the long side of the first opening may satisfy the equation: $0.3 \times (A-B_1-B_2)/C < L < 0.5 \times (A-B_1-B_2)/C$, where A denotes a short side direction length of the cover panel, $B_1$ denotes a short side direction length of the first bended area, $B_2$ denotes a short side direction length of the second bended area, and C denotes a number of first openings arranged along a short side direction of the cover panel.

A sum of a total planar area of the plurality of first openings and a total planar area of the plurality of second openings may be less than about 15% of a total planar area of the heat dissipation member.

A shape of the second opening may be a square of which a length of one side length thereof is about 1 millimeter (mm) or less.

Each side of the second opening may be perpendicular to or parallel with a long side of the display panel.

A total planar area of the plurality of second openings may be about 5% to about 20% of a total planar area of the bent portion.

An outer edge of the heat dissipation member may be spaced apart from a corresponding outer edge of the display panel by about 0.1 mm to about 0.5 mm.

The cover panel may further include a first adhesive layer on a first side of the heat dissipation member and a second adhesive layer on a second side of the heat dissipation member which is opposite to the first side thereof. The first adhesive layer and the second adhesive layer may be connected to each other at each of the plurality of first openings and the plurality of second openings.

The cover panel may further include a shield layer attached to the heat dissipation member by the first adhesive layer.

The cover panel may further include an impact absorption layer attached to the heat dissipation member by the second adhesive layer.

The display device may further include a window attached to a front side of the display panel, the cover panel facing a rear side of the display panel which is opposite to the front side thereof.

A display device according to an embodiment includes: a display panel including: a long side and a short side, a length of the short side being smaller than a length of the long side, a flat area, and a bended area which extends bent from the flat area; and a heat dissipation member including: a flat portion corresponding to the flat area of the display panel, a bent portion corresponding to the bended area of the display panel, and a plurality of first openings in the flat portion. Each of the plurality of first openings has a shape of a quadrangle having a first side and a second side which is shorter than the first side, the first side being perpendicular to the long side of the display panel.

The heat dissipation member may include a plurality of second openings in the bent portion.

The display device may further include a first adhesive layer in contact with a first side of the heat dissipation member and a second adhesive layer in contact with a second side of the heat dissipation member which is opposite to the first side thereof. The first adhesive layer and the second adhesive layer may be connected to each other at each of the plurality of first openings and the plurality of second openings.

The display device may further include a shield layer attached to the heat dissipation member by the first adhesive layer or the second adhesive layer, and the shield layer may include a metal.

The heat dissipation member may include a carbon material.

The display device may include a cover panel including the heat dissipation member, a flat area corresponding to the flat area of the display panel, and a first bended area and a second bended area at opposing sides of the flat area of the cover panel, and a length L of the first side of the first opening may satisfy the equation: $0.3 \times (A-B_1-B_2)/C < L < 0.5 \times (A-B_1-B_2)/C$, where A denotes a short side direction length of the cover panel, $B_1$ denotes a short side direction length of the first bended area, $B_2$ denotes a short side direction length of the second bended area, and C denotes the number of the first openings arranged along the short side direction of the cover panel.

According to one or more embodiments, heat dissipation capability of the display device is improved and damage to the heat dissipation member during a manufacturing process or a rework process of the display device is reduced or effectively prevented. In addition, even if not specifically mentioned, the embodiments may obtain an effect that may be recognized throughout the specification.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
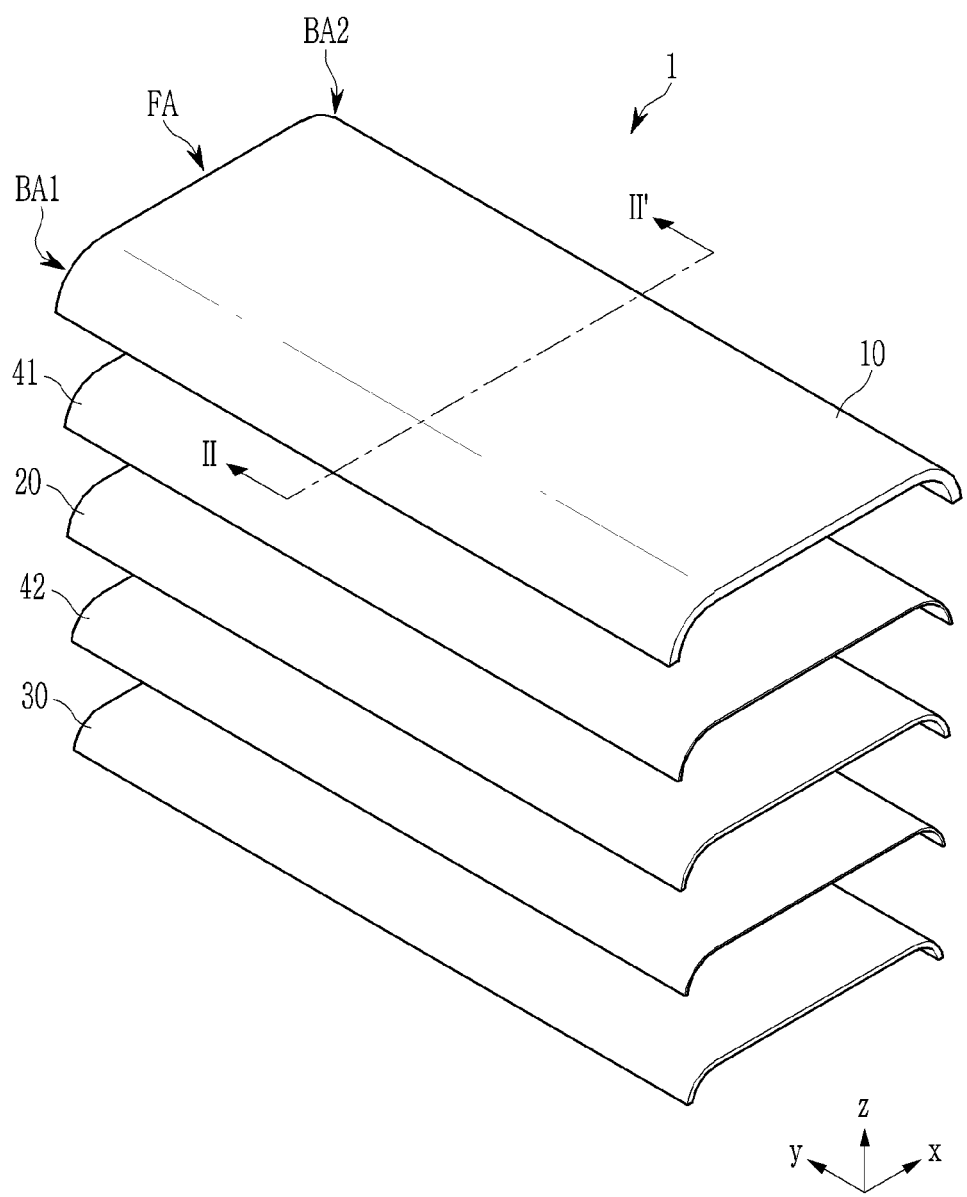
FIG. 1 is an exploded perspective view of an embodiment of a display device.

In the following detailed description, embodiments of the invention are shown and described, simply by way of illustration. As those skilled in the art would realize, the described embodiments may be modified in various different ways, all without departing from the spirit or scope of the invention.

Like reference numerals designate like elements throughout the specification

A size and a thickness of each element illustrated in the drawings are arbitrarily illustrated for convenience of the description. In the drawings, the thickness of layers, films, panels, regions, etc., are exaggerated for clarity. In addition, in the drawing, for convenience of description, the thickness of some of layers, films, panels, regions, etc., are exaggerated.

It will be understood that when an element such as a layer, film, region, or substrate is referred to as being related to another element such as being "on" another element, it may be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, throughout the specification, unless explicitly described to the contrary, the word "comprise" and variations such as "comprises" or "comprising" will be understood to imply the inclusion of stated elements but not the exclusion of any other elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," may therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" may, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10% or 5% of the stated value.

In addition, in this specification, the phrase "on a plane" means viewing a target portion from the top, and the phrase "on a cross-section" means viewing a cross-section formed by vertically cutting a target portion from the side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the symbol x is used to indicate the direction is a first direction, y is a second direction that intersects or crosses the first direction, and z is a third direction that intersects or crosses both the first direction and the second direction. The third direction z may define a thickness of a component or element.

Figure 2:
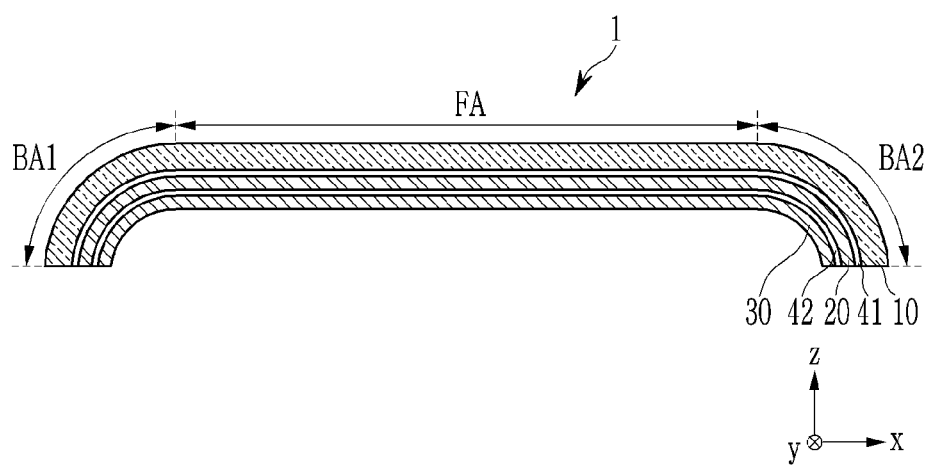
FIG. 2 is a cross-sectional view of FIG. 1, taken along line II-II'.
Figure 3:
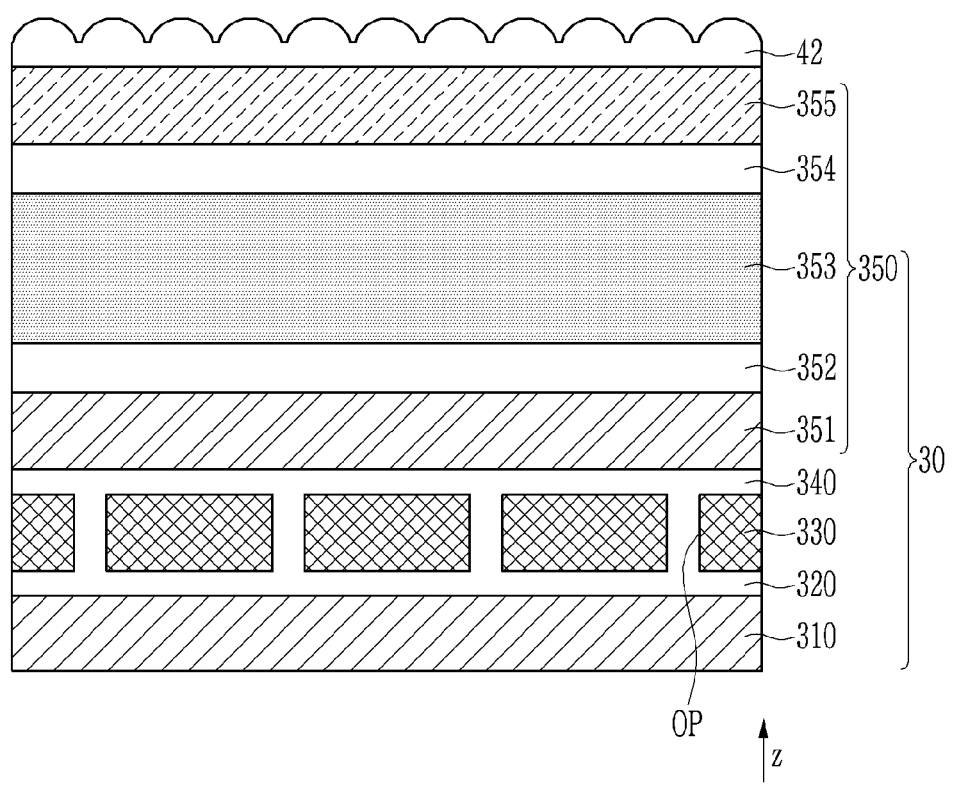
FIG. 3 is an enlarged cross-sectional view of an embodiment of a cover panel in a display device.

FIG. 1 is an exploded perspective view of an embodiment of a display device 1, FIG. 2 is a cross-sectional view of FIG. 1, taken along line II-II', and FIG. 3 is an enlarged cross-sectional view of an embodiment of a cover panel 30 in the display device 1.

Referring to FIG. 1 and FIG. 2, the display device 1 may include a window 10, a display panel 20 disposed at a rear side of the window 10, and the cover panel 30 disposed at a rear side of the display panel 20. The display device 1 may be an electronic device such as a smart phone, a tablet, a multiplayer, a portable information terminal, and the like, or a module used in such an electronic device.

One or more areas among four edge areas of the display device 1 may be bent. The edge areas may be defined by one or more element or component within the display device 1. In the illustrated embodiment, a pair of edge areas that face each other along the first direction x are bent in the display device 1. When the edge areas are bent, the display device 1 may include a substantially flat area FA, and first and second bended areas BA1 and BA2 that are disposed at opposite sides of the flat area FA along the first direction x and at which the display device 1 is bent relative to the flat area FA. Each of the first and second bended areas BA1 and BA2 extends bent from the flat area FA. In the display device 1, the window 10, the display panel 20, and the cover panel 30 may each include a flat area FA and bended areas BA1 and BA2 that respectively correspond to the flat area FA and the bended areas BA1 and BA2 of the display device 1. That is, the flat area FA and the bended areas BA1 and BA2 of the display device 1 may be a flat area FA and bended areas BA1 and BA2 of each element of the display device 1 among the window 10, the display panel 20, and the cover panel 30.

In the display device 1, the window 10, the display panel 20, and the cover panel 30 may be bonded to each other. An adhesive such as an optically clear adhesive ("OCA") may be used to bond the window 10 and the display panel 20 to each other, and an adhesive layer 41 including or formed of such an adhesive may be disposed between the window 10 and the display panel 20. For the attachment of display panel 20 and cover panel 30, an adhesive layer 42 may be placed between the display panel 20 and the cover panel 30.

The window 10 protects the display panel 20 from an external environment, an impact, and the like. The window 10 may define an outer surface of the display device 1. The window 10 may serve as a support to maintain the display panel 20 bent. The window 10 may include or be formed of a transparent and relatively rigid material such as glass or plastic so that an image displayed at a display screen of display panel 20 may be viewable through the window 10 from outside the display device 1. In the window 10, an area corresponding to at least the display screen of the display panel 20 may be optically transparent. Bending of the window 10 may be performed by thermoforming, for example, a glass plate, a plastic plate, and the like.

The display panel 20 may be a light emitting display panel that includes a light emitting element such as a light emitting diode. The display panel 20 may be at least partially flexible. The display panel 20 may include a display area that corresponds to the display screen where an image is displayed, and a non-display area where no image is displayed. A pixel (or pixel area) provided in plural (e.g., pixels or pixel areas) are arranged in the display area, and the image may be displayed by a combination of pixels being driven or controlled. A signal line provided in plural (e.g., signal lines) that transmit electrical signals for driving or controlling the pixels are arranged in the display area. In an embodiment, for example, the signal lines may include one or more of a gate line that transmits gate signals as electrical signals and extends along the first direction x, and one or more of a data line that transmits data signals as electrical signals and extend along a second direction y. Each pixel is connected with a driving element such as a transistor TR that is connected with a data line and a gate line, and may receive a data signal (e.g., voltage) as an electrical signal that controls luminance of a pixel at predetermined timing.

The non-display area may be disposed at the periphery of an edge of the display panel 20, and may be adjacent to the display area. In an embodiment, the display area may surround the display area in a plan view. The non-display area is an area where circuit elements and/or wires are disposed to generate and/or deliver the various electrical signals applied to the display area. A pad portion including a pad provided in plural (e.g., pads) may be disposed in the non-display area. The pad portion may receive electrical signals from outside the display panel 20 and/or output electrical signals to a component external to or outside of the display panel 20. The pad portion of the display panel 20 may be bonded with a flexible printed circuit film as a component external to the display panel 20.

The flat area FA may be disposed in a plane defined by the first direction x and the second direction y. A dimension of the opposite edge areas may correspond to or define a dimension of the non-display area. Since opposite edge areas of the display panel 20 are bent with respect to the flat area FA, the opposite edge areas occupy less planar area defined along the first direction x and the second direction y. Since the planar area of the edge areas is reduced, the non-display area of the display device 1 may be reduced when viewed from the front (e.g., in the plan view). Thus, in a view from the front of the display device 1, a display area of the display device 1 may occupy most of the planar area of the display device 1, and the screen-to-body ratio of the display device 1 may be maximized. As used herein, the "screen-to-body ratio" may indicate a planar area of a display screen and/or display area, with respect to a total planar area of the display device 1, such as taken in a plane defined by the first direction x and the second direction y.

The cover panel 30 protects the display panel 20 from the environment at the back of the display panel 20 (e.g. impact, electromagnetic waves, noise, etc.). The cover panel 30 may also diffuse heat generated in the display panel 20. In an embodiment, the cover panel 30 may reduce or effectively prevent transfer to the display panel 20 of the heat generated from a processor, a battery, a memory, etc., which may be located on the back of the display panel 20 in an electronic device. The cover panel 30 may be otherwise referred to as a protection sheet, a lower sheet, and the like.

FIG. 3 shows an enlarged cross-sectional structure of an embodiment of the cover panel 30, which may be included in the above-described display device 1. Referring to FIG. 3, the cover panel 30 may have a structure in which a plurality of layers are stacked. The cover panel 30 may include a shield layer 310, a heat dissipation member 330, and an impact absorption layer 350. Adhesive layers 320 and 340 may be disposed between the respective layers for attachment therebetween. The adhesive layer 42 may be disposed on the upper surface of the cover panel 30 so as to be bonded with the display panel 20.

The shield layer 310 may reduce or effectively prevent electromagnetic waves, static electricity, and noise from flowing from an environment at the back of the cover panel 30, to the display panel 20. The shield layer 310 may improve a heat dissipation characteristic of the heat dissipation member 330. The shield layer 310 may be a metal layer including a metal or material having excellent thermal conductivity along with shield performance such as copper and aluminum.

The heat dissipation member 330 may serve to dissipate heat generated from a heat generating element or heat source, such as a processor and a battery, within the display device 1. The heat dissipation member 330 may include a material having excellent heat conductivity. The heat dissipation member 330 may include a carbon material such as graphite, graphene, carbon nanotubes, and the like. The heat dissipation member 330 may have a thickness of about 5 micrometers (μm) to about 50 μm, and for example, may be about 25 μm.

The heat dissipation member 330 may include an opening OP provided in plural (e.g., a plurality of openings OP) that penetrate the body of the heat dissipation member 330 along the thickness direction (e.g., the third direction z). Portions of the heat dissipation member 330 may define the openings OP. The adhesive layer 320 and/or the adhesive layer 340 is extended into the opening OP of the heat dissipation member 330 not only to improve bonding force of the heat dissipation member 330 and the shield layer 310 to each other and/or the heat dissipation member 330 and the impact absorption layer 350 to each other, but also to reduce or effectively prevent separation of the heat dissipation member 330 from other layers within the cover panel 30. In an embodiment, for example, when the heat dissipation member 330 includes graphite, the graphite has a relatively weak delamination force, so that the heat dissipation member 330 may be peeled off or separated from another layer during a rework process of separating a member (e.g., a frame, a printed circuit board, a battery, and the like) attached to the back of the cover panel 30 during the rework process of the display device 1.

The adhesive layers 320 and 340 on both of opposing sides of the heat dissipation member 330 are connected to each other at the opening OP of the heat dissipation member 330 to relatively firmly attach the heat dissipation member 330 to other layers within the cover panel 30 and reduce or effectively prevent the heat dissipation member 330 from peeling off another layer. That is, the adhesive layers 320 and 340 in the openings OP extend to outside the heat dissipation member 330 at opposing sides thereof for contact with layers adjacent to the heat dissipation member 330. In an embodiment, the first adhesive layer 320 is in contact with a first side of the heat dissipation member 330 which faces the display panel 20, and a second adhesive layer 340 is in contact with a second side of the heat dissipation member which is opposite to the first side thereof. The outer edge of the heat dissipation member 330 may be covered by the adhesive layers 320 and 340. The adhesive layers 320 and 340 may include or be formed with a thermoset adhesive. The adhesive layers 320 and 340 may together form an adhesive member within the cover panel 30.

The impact absorption layer 350 may include a first support layer 351, a cushion layer 353, and a second support layer 355. The first and second support layers 351 and 355 may be plastic layers including a polymer such as polyimide ("PI") and polyethylene terephthalate ("PET"), and the like. The first and second support layers 351 and 355 may serve to bond the cushion layer 353 disposed therebetween to another layer or member. The cushion layer 353 may absorb impact thereto and reduce or effectively prevent damage to the display panel 20. The cushion layer 353 may be a porous layer including or formed of a material such as polyurethane or polyethylene. The cushion layer 353 may include a foam resin. The cushion layer 353 may include an elastomer.

Adhesive layers 352 and 354 may be respectively disposed between the first support layer 351 and the cushion layer 353 and between the cushion layer 353 and the second support layer 355. A pressure sensitive adhesive ("PSA") may be used to form the adhesive layers 352 and 354.

Figure 4:
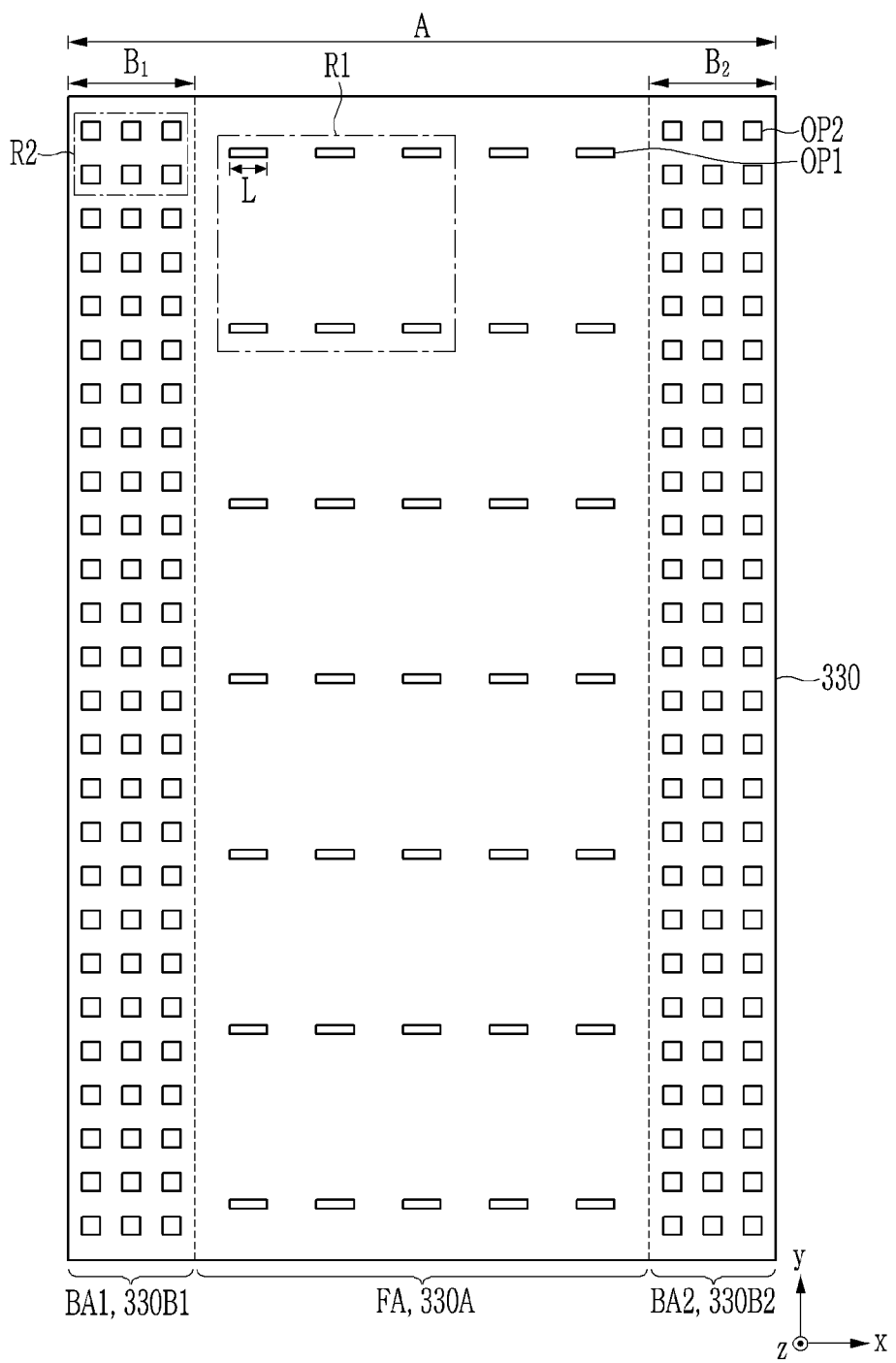
FIG. 4 is a top plan view of an embodiment of the heat dissipation member in a display device.
Figure 5:
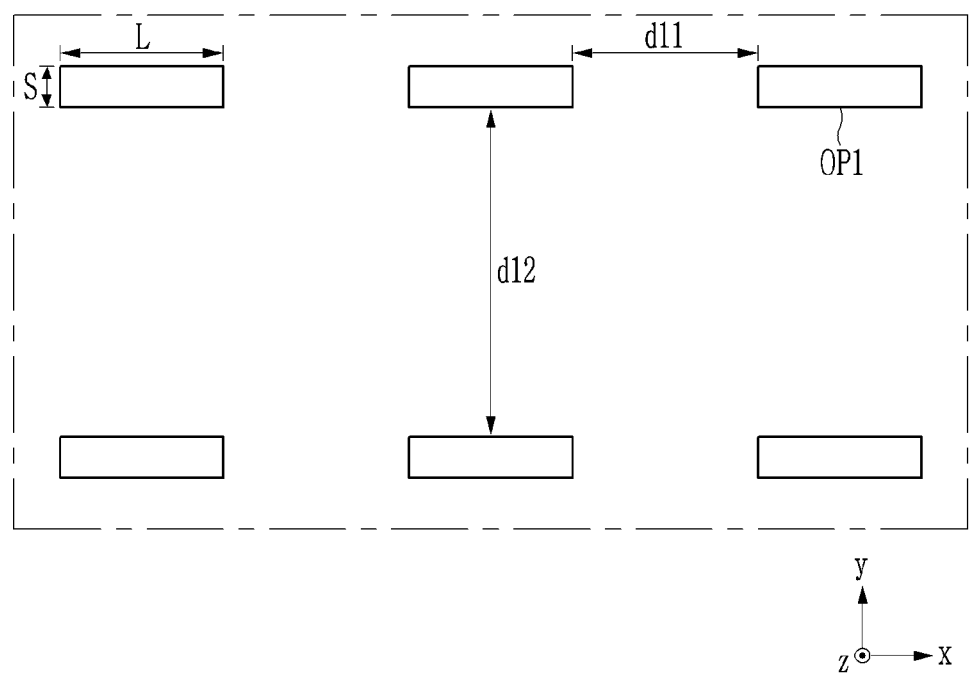
FIG. 5, FIG. 6, and FIG. 7 each illustrates embodiments of openings of the heat dissipation member in a display device.
Figure 6:
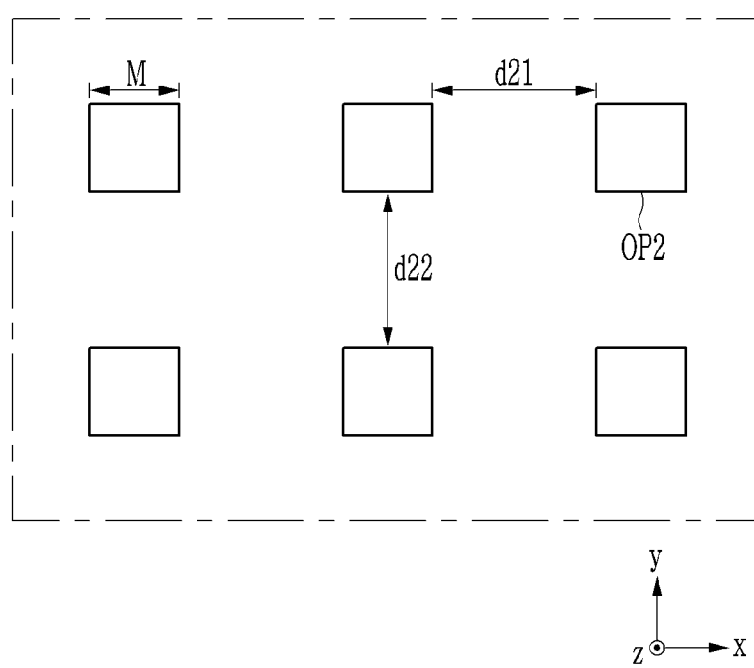
Figure 7:
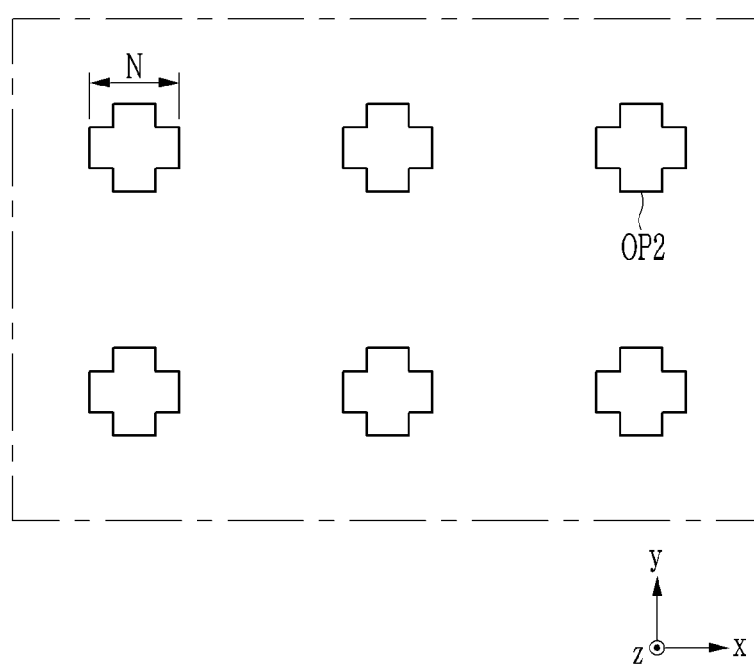

FIG. 4 is a top plan view of an embodiment of the heat dissipation member 330 in the display device 1, and each of FIG. 5, FIG. 6, and FIG. 7 is an enlarged top plan view illustrating an embodiment of a first opening OP1 and a second opening OP2 of the heat dissipation member 330 of the display device 1. FIG. 5 corresponds to the area R1 of FIG. 4, and FIG. 6 and FIG. 7 correspond the area R2 of FIG. 4.

FIG. 4 is a top plan view that shows the heat dissipation member 330 which is separated from the above-described display device 1. The heat dissipation member 330 may have the same planar shape as the display panel 20 as a whole. That is, four edges of the heat dissipation member 330 may match or correspond to the four edges of the display panel 20. The display panel 20 may be completely overlapped with the heat dissipation member 330 shown in FIG. 4.

A total planar area of the heat dissipation member 330 may be smaller than a total planar area of the display panel 20. In an embodiment, for example, along the plane which is defined by the first direction x and the second direction y, at least one edge of the heat dissipation member 330 may be spaced apart from a corresponding edge of the display panel 20 by about 0.1 millimeter (mm) to about 0.5 mm. In this case, since the edge of the heat dissipation member 330 is covered by the adhesive layers 320 and 340, starting of peeling of the heat dissipation member 330 from the edge of the heat dissipation member 330 may be reduced or effectively prevented.

The heat dissipation member 330 may include a flat portion 330A disposed in a flat area FA of the display device 1, and first and second bent portions 330B1 and 330B2 that are disposed in the first and second bended areas BA1 and BA2 of the display device 1. The flat portion 330A is substantially flat (e.g., disposed in a single plane, such as defined by the first direction x and the second direction y), and the first and second bent portions 330B1 and 330B2 are bent with a predetermined curvature radius from an edge or boundary of the flat portion 330A. The flat portion 330A may correspond to the flat area FA of the display panel 20 and the cover panel 30, and the first and second bent portions 330B1 and 330B2 may correspond to the bended areas BA1 and BA2 of the display panel 20 and the cover panel 30. As described, the heat dissipation member 330 is arranged to cover an entirety of the display panel 20, that is, not only the flat area FA but also the bended areas BA1 and BA2 of the display panel 20, such that a heat dissipation area and a heat dissipation effect may be increased.

The flat portion 330A of the heat dissipation member 330 includes the first opening OP provided in plural (e.g., first openings OP1), and the first and second bent portions 330B1 and 330B2 of the heat dissipation member 330 include the second opening OP2 provided in plural (e.g., second openings OP2). The first openings OP1 penetrate or extend through a thickness of the heat dissipation member 330 at the flat portion 330A, and the second opening OP2 penetrate or extend through a thickness of the heat dissipation member 330 at the first and second bent portions 330B1 and 330B2. As described, the first and second openings OP1 and OP2 may reduce the effective heat dissipation area of the heat dissipation member 330 (e.g., the planar area of the heat dissipation member 330 corresponding to the display panel 20), and may reduce or effectively prevent peeling off of the heat dissipation member 330 from another layer or element.

The heat dissipation member 330 may include solid portions which define the first and second openings OP1 and OP2. The first and second openings OP1 and OP2 may penetrate through an entire thickness of the body of the heat dissipation member 330, along the third direction z. Referring to FIG. 4, for example, solid portions may be disposed between first and second openings OP1 and OP2 respectively adjacent to each other.

In an embodiment, for example, when the heat dissipation member 330 includes or is formed of graphite, since the graphite is composed of Van der Waals bonds, a peel force between layers constituting the graphite is relatively weak (measured value: about 90 grams-force per 23 mm (gf/25 mm)). Moreover, the first and second bent portions 330B1 and 330B2 are likely to peel off from a layer or element adjacent thereto, due to a bending load. According to an embodiment, the adhesive layers 320 and 340 that are connected to teach other at the first and second openings OP1 and OP2 while being respectively disposed on each of opposing sides (e.g., top surface and bottom surface) of the heat dissipation member 330 may be strongly combined with each other, and thus peeling off of the heat dissipation member 330 may be reduced or effectively prevented.

A total planar area of the first and second openings OP1 and OP2 is less than 20%, less than 15%, less than 10%, or less than 5% of a total planar area of the heat dissipation member 330, so that the first and second openings OP1 and OP2 do not deteriorate the heat dissipation characteristic of the heat dissipation member 330. Here, the total area of the heat dissipation member 330 is limited or defined by the edges (e.g., outer) of the heat dissipation member 330.

In order to reduce or effectively prevent delamination of the heat dissipation member 330 from a layer or element adjacent thereto, while increasing the effective heat dissipation area of the heat dissipation member 330, the first openings OP1 and the second openings OP2 may be provided and arranged at predetermined sizes and intervals.

Referring to FIG. 4 and FIG. 5, the first openings OP1 may be arranged approximately in a matrix format, within a total planar area of the flat portion 330A. The first opening OP1 may be approximately formed in the shape of a quadrangle, such as a rectangle, having relatively long and relatively short sides. The relatively long sides of the first opening OP1 may be extended corresponding to a relatively short side (e.g., corresponding to the first direction x) of the display panel 20, the cover panel 30, and the heat dissipation member 330.

An adhesive tape (e.g., a tape of which adherence is deteriorated when heat is applied, such as an "HR tape") attached to the back of the cover panel 30 for attachment thereof with another layer or member, may be separated from the cover panel 30 in a direction of the relatively long side (e.g., corresponding to the second direction y) of the display panel 20, the cover panel 30, and the heat dissipation member 330 during a rework process. During such a rework process, the heat dissipation member 330 may be peeled off when the adhesive tape is detached.

In order to reduce or effectively prevent peeling of the heat dissipation member 330, the first opening OP1 may be provided or formed such that a length L of the relatively long side of the first opening OP1 (hereinafter referred to as "long side length L") satisfies the following equation.

$$0.3 \times (A-B_1-B_2)/C < L < 0.5 \times (A-B_1-B_2)/C$$

Referring to FIG. 4 and the above equation, A denotes a length of the cover panel 30 along the short side direction (e.g., the first direction x) thereof (hereinafter referred to as "short side direction length"), $B_1$ denotes a short side direction length of the first bended area BA1 of the cover panel 30, $B_2$ denotes a short side direction length of the second bended area BA2 of the cover panel 30, and C denotes the number of first openings OP1 arranged along the short side direction of the cover panel 30.

The short side direction length of the cover panel 30 may be defined by a length of the longest layer along the short side direction among the plurality of layers within the cover panel 30 (e.g., the shield layer 310, the adhesive layer 320, the heat dissipation member 330, the adhesive layer 340, and the impact absorption layer 350).

In an embodiment, for example, when A is 65.28 millimeters (mm), $B_1$ and $B_2$ are respectively 6.6 mm, and C is 5, a long side length L of the first opening OP1 is about 3.12 mm to about 5.2 mm according to the above-stated equation. When the long side length L of the first opening OP1 is less than 3.12 mm, securing effective adherence to minimize peeling of the heat dissipation member 330 may be difficult. The heat dissipation effect may be deteriorated when the long side length L is 5.2 mm or more.

In the above equation, A may be substantially equivalent to a short side direction length of the heat dissipation member 330, $B_1$ may be substantially equivalent to a short side direction length of the first bent portion 330B1, and $B_2$ may be substantially equivalent to a short side direction length of the second bent portion 330B2. Thus, $A-B_1-B_2$ may be substantially equivalent to a short side direction length (corresponding to the first direction x) of the flat portion 330A of the heat dissipation member 330. The number of first openings OP1 arranged along the first direction x, which is a short side direction of the display panel 20 shown in FIG. 4, is 5.

A length S of the relatively short side of the first opening OP1 (hereinafter referred to as "short side length S") is smaller than a length L of the long side, and may be about 0.3 mm or less. In an embodiment, for example, the short side length S of the first opening OP1 may be about 0.21 mm. The planar area of the first opening OP1 is increased as the short side length S is increased such that the effective heat dissipation area of the heat dissipation member 330 is reduced. Conversely, when the short side length S is significantly small, the adhesive layers 320 and 340 may be relatively easily peeled off, and permeation of the adhesive material of such layers into the first opening OP1 may be difficult.

The effective heat dissipation area of the heat dissipation member 330 (e.g., the total planar area of the heat dissipation member 330 excluding a sum of the total planar area of the first openings OP1 and the total planar area of the second openings OP2) increases as the planar areas of the first openings OP1 and second openings OP2 are reduced. In an embodiment, for example, the effective heat dissipation area of the heat dissipation member 330 may be more than about 85%, 90%, or 95% of the entire planar area of the heat dissipation member 330 when a sum of the total planar area of the first openings OP1 and the total planar area of the second openings OP2 is less than about 15%, 10%, or 5%, respectively.

The effective heat dissipation area of the heat dissipation member 330 has a trade-off or inverse relationship with the planar area of the first and second openings OP1 and OP2 for reducing or effectively preventing delamination of the heat dissipation member 330 from another layer. However, in one or more embodiment, when the first openings OP1 are provided or formed having a rectangular shape having a relatively long side parallel with the short side directions of the display panel 20, the cover panel 30, and the heat dissipation member 330, peeling off of the heat dissipation member 330 may be reduced or effectively prevented even if the planar area of the first openings OP1 decreases.

Figure 8:
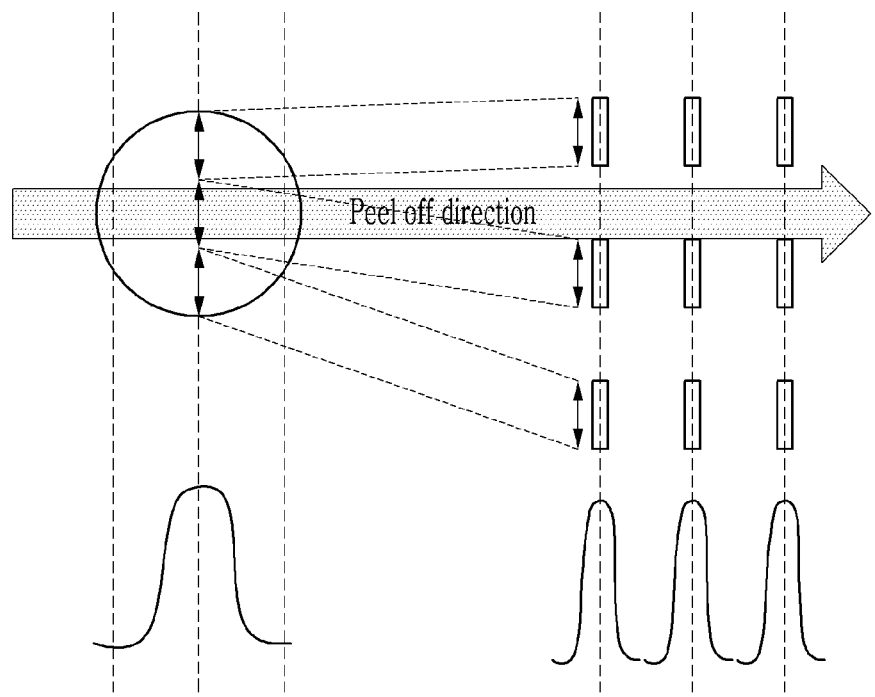
FIG. 8 is provided for description of peeling forces when a heat dissipation member includes a circular-shaped opening and a rectangular-shaped opening.

Referring to FIG. 8 together with FIG. 5, the left view shows a bonded area corresponding to the diameter of a circular opening having a relatively large planar area, relatively to a peeling off direction, in order to reduce or effectively prevent the heat dissipation member 330 from peeling off another layer. The right view shows a bonded area corresponding to a rectangular shape opening having a relatively long side perpendicular to the peeling off direction. In a direction perpendicular to the peeling off direction, the diameter of the circular opening (left view) is larger (e.g., approximately 3 times larger) than the long side length of the rectangular opening (right view). Even though the planar area of the rectangular opening (right view) is smaller than the planar area of the circular opening (left view), an effective bonding length (e.g., the long side length L of the first opening OP1) for reducing or effectively preventing the heat dissipation member from peeling off may be maintained.

Referring to FIGS. 4, 5 and 8 together, the peeling off direction may correspond to the long side direction of the display device 1 or component thereof (e.g., the second direction y), without being limited thereto. The peeling off direction may correspond to a separation direction in which layers are separated from each other during a rework process.

Referring to FIG. 4 and FIG. 6, the second opening OP2 may be provided having a substantially square shape such that the first and second bent portions 330B1 and 330B2 of the heat dissipation member 330 may cope with both stress acting in a bending direction (e.g., along the first direction x) and stress acting in a separation direction during rework (e.g., second direction y). The second opening OP2 may have an approximately square shape of which a length M along one side is about 1 mm or less. The second opening OP2 may be defined such that each side is perpendicular or parallel to the peeling off direction that corresponds to the second direction y. In consideration of the effective heat dissipation area and the peel force of the heat dissipation member 330 relative to another layer, the total planar area defined by the second openings OP2 in both the first and second bent portions 330B1 and 330B2, may be about 5% to about 20% a total planar area of the first and second bent portions 330B1 and 330B2. In an embodiment, the total planar area defined by the second openings OP2 in a respective one among the first and second bent portions 330B1 and 330B2, may be about 5% to about 20% a total planar area of the respective one among the first and second bent portions 330B1 and 330B2.

Referring to FIG. 7, the second opening OP2 may have a cross shape. A total width N of the cross-shaped second opening OP2 may be about 1 mm or less. The second opening OP2 may have various shapes other than square and the cross. In an embodiment, for example, the second opening OP2 may have a rectangular shape having a long side length of about 1 mm or less or a circular shape having a diameter of about 1 mm or less.

Referring to FIG. 5 and FIG. 6, the first openings OP1 and the second openings OP2 may be disposed at predetermined intervals along the first direction x and the second direction y, within a respective one among the flat portion 330A and the first and second bent portions 330B1 and 330B2.

In an embodiment, for example, the first openings OP1 and the second openings OP2 may be arranged in the following sizes and intervals in order to obtain an effective heat dissipation area of about 90% in the heat dissipation member 330 applied to a rectangular display panel 20 with long side and short side lengths of about 134.29 mm and about 65.28 mm, respectively. Rectangular-shaped first openings OP1, each having a long side length of about 4 mm and a short side length of about 0.21 mm, are arranged at an interval d11 of about 4.3 mm along the first direction x and arranged at an interval d12 of about 17.7 mm along the second direction y. In this alignment, approximately 15 first openings OP1 (5×7) may be disposed in the flat portion 330A as shown in FIG. 4.

Square-shaped second openings OP2, each having a side length M of about 0.8 mm, are arranged at an interval d21 of about 1.7 mm along the first direction x and arranged at an interval d22 of about 1 mm along the second direction y. Unless otherwise stated, peel force test data described below are obtained from the heat dissipation member 330 having the first and second openings OP1 and OP2 with the dimensions and arranged at the intervals described in this paragraph and applied to the display panel 20 having the size described in this paragraph.

In an embodiment, the relatively fine sized first and second openings OP1 and OP2 may be provided or formed by laser processing. According to one experiment, a square opening having one side length of about 120 μm may be provided or formed through laser perforation, and a circular opening having a diameter of about 17 μm may be provided or formed.

Figure 9:
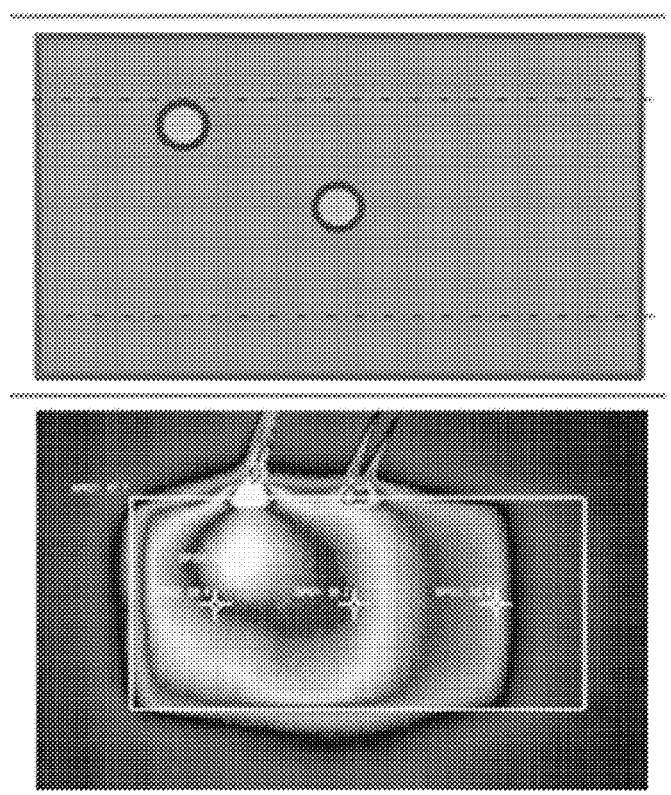
FIG. 9 shows a temperature distribution in an embodiment of a display device.

FIG. 9 shows a temperature distribution in an embodiment of the display device 1.

In FIG. 9, the upper view shows alignment of two heat sources (e.g., a processor and a camera) disposed on a rear side of the cover panel 30 in the display device 1, and the lower view shows a temperature distribution of the display panel 20 in the display device 1. The heat dissipation member 330 according to the embodiment described with reference to FIG. 3 to FIG. 5 was applied to the cover panel 30 within the display device 1, and the maximum temperature of the display panel 20 was measured after operating the heat source for 30 minutes with power of 4.5 volts (V) in the environment of 24.0 degrees Celsius (° C.) to 24.5° C.

As a comparative example, a comparative heat dissipation member includes only a flat portion 330A and excludes bent portions 330B1 and 330B2 corresponding to the bended areas BA1 and BA2 of the display panel 20. The comparative heat dissipation member includes circular-shaped first openings having a diameter of 4 mm in the same number as the first openings OP1 of the embodiment was applied to a display device 1, and the maximum temperature of the display panel 20 was measured under the same conditions.

As shown in Table 1 below, when the embodiment of the heat dissipation member 330 is applied in the display device 1, the maximum temperature of the display panel 20 was about 1.05° C. lower than that of the comparative example.

TABLE 1

|  | Effective heat dissipation area | Max temperature of display panel |
| --- | --- | --- |
| Comparative Example | 67% | 36.75° C. |
| Embodiment | 90% | 35.7° C. |

Figure 10:
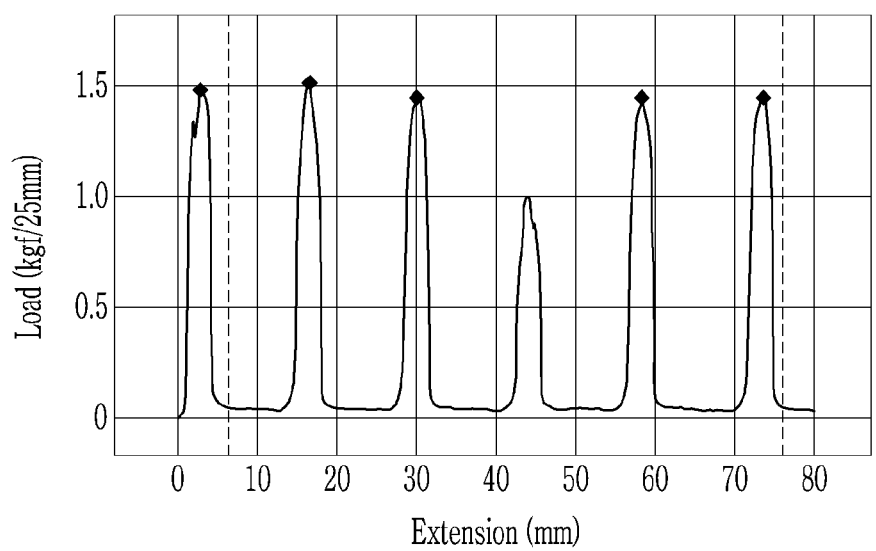
FIG. 10 is graph that shows a result of testing a peeling force of an embodiment of the heat dissipation member in a display device.
Figure 11:
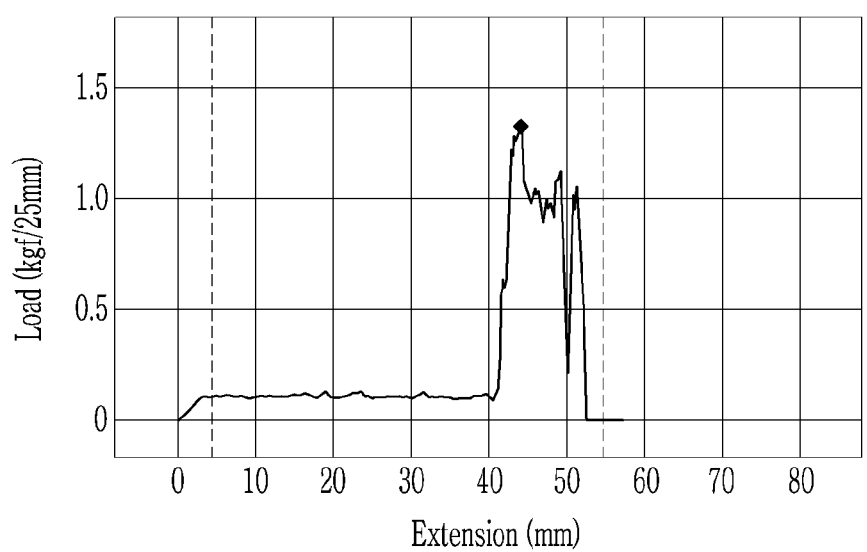
FIG. 11 is graph that shows a result of testing a peeling force of the bent portion of an embodiment of the heat dissipation member in a display device.

FIG. 10 and FIG. 11 are graphs that show a result of testing a peeling force of an embodiment of the heat dissipation member 330 in the display device 1. FIG. 10 shows a peeling force of the flat portion 330A of the heat dissipation member 330, and FIG. 11 shows a peeling force of the bent portions 330B1 and 330B2 of the heat dissipation member 330. In the heat dissipation member 330, the first opening OP1 is a rectangle having a long side length and a short side length respectively of about 4 mm and about 0.21 mm, and the second opening OP2 is a square having one side length of about 0.8 mm. In each graph of FIG. 10 and FIG. 11, points along the heat dissipation member 330 (Extension in mm) at which the peeling force (Load in kilogram-force per 25 millimeters, kgf/25 mm) is increased corresponds to locations along the heat dissipation member 330 where the first and second openings OP1 and OP2 are provided.

Referring to FIG. 10, locations of the heat dissipation member 330 at which the first openings OP1 are provided has a peeling force of about 1500 gf/25 mm. This result exceeds the peel force (approximately 1250 gf/25 mm) measured in the comparative heat dissipation member of the comparative example in which the circular-shaped openings (refer to FIG. 8, for example) with a 4 mm diameter are provided. Referring to FIG. 11, the peeling force of the locations of the heat dissipation member 330 at which the second opening OP2 are provided was also measured as high as about 1350 gf/25 mm. As described with reference to FIG. 9 to FIG. 11, according to the embodiment of the heat dissipation member 330, not only may the heat dissipation performance of the heat dissipation member 330 be improved, but also the peel force of the heat dissipation member 330 may be increased to reduce or effectively prevent peeling of the heat dissipation member 330 from another layer.

Figure 12:
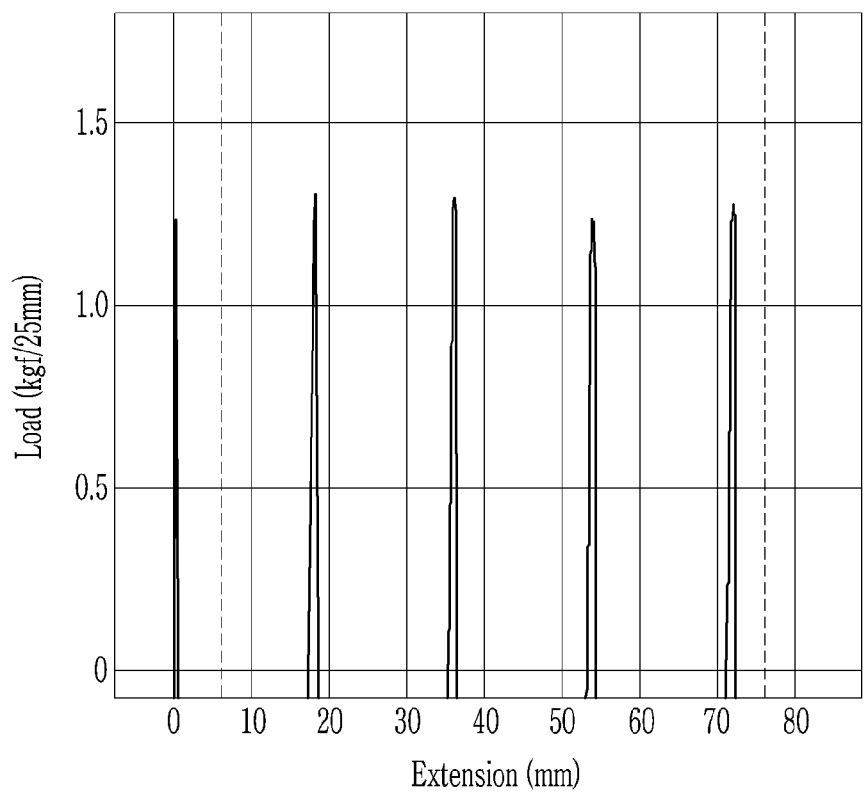
FIG. 12 is a graph that shows a peeling force of a flat portion of an embodiment of a heat dissipation member of a display device.
Figure 13:
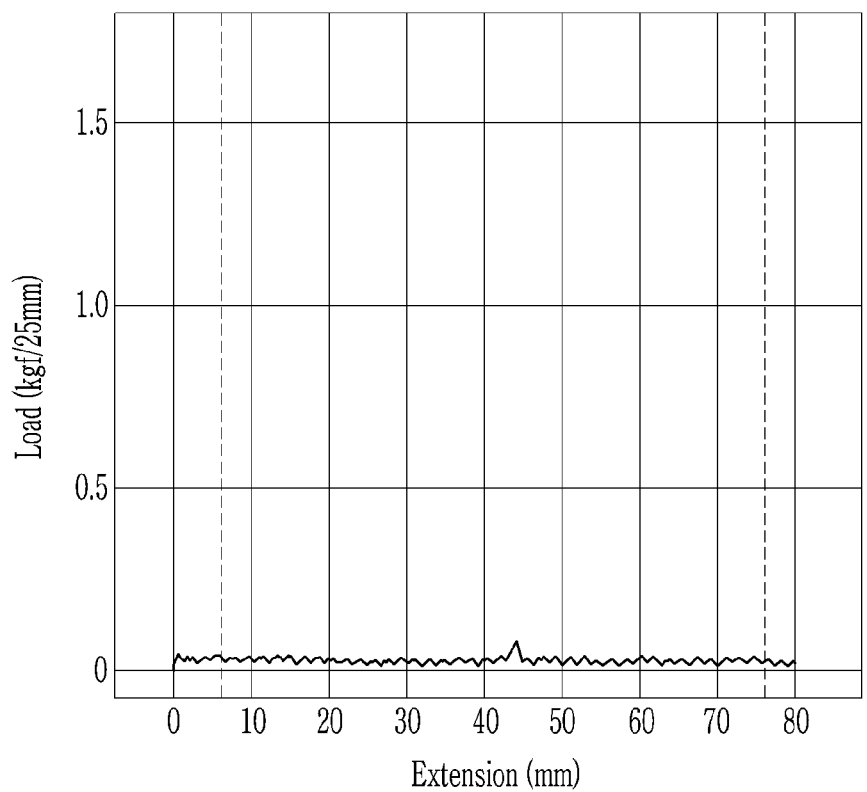
FIG. 13 is a graph that shows a peeling force of a flat portion of a comparative heat dissipation member of a display device.

FIG. 12 is a graph that shows a peeling force of a flat portion 330A of a heat dissipation member 330 of an embodiment of a display device 1, and FIG. 13 is a graph that shows a peeling force of a flat portion of a comparative heat dissipation member in a display device.

FIG. 12 shows a peeling force of a heat dissipation member 330 in which rectangular-shaped first openings OP1, each having a long side length L of 3.12 mm, are provided. As shown in the drawing, the peeling force of the area where the first openings OP1 of the heat dissipation member 330 are provided was about 1250 gf/25 mm.

However, when the long side length L of the first opening OP1 is shorter than 3.12 mm, securing adherence of the heat dissipation member 330 to another layer to reduce or effectively prevent delamination of the heat dissipation member 330 from the other layer may be difficult. For example, FIG. 13 shows the peel force of the heat dissipation member 330 in which rectangular-shape first openings OP1 with a long side length L of 2.67 mm are provided. Referring to FIG. 13, the peel force was very low (about 50 gf/25 mm) in all areas even though the first openings OP1 were formed.

Figure 14:
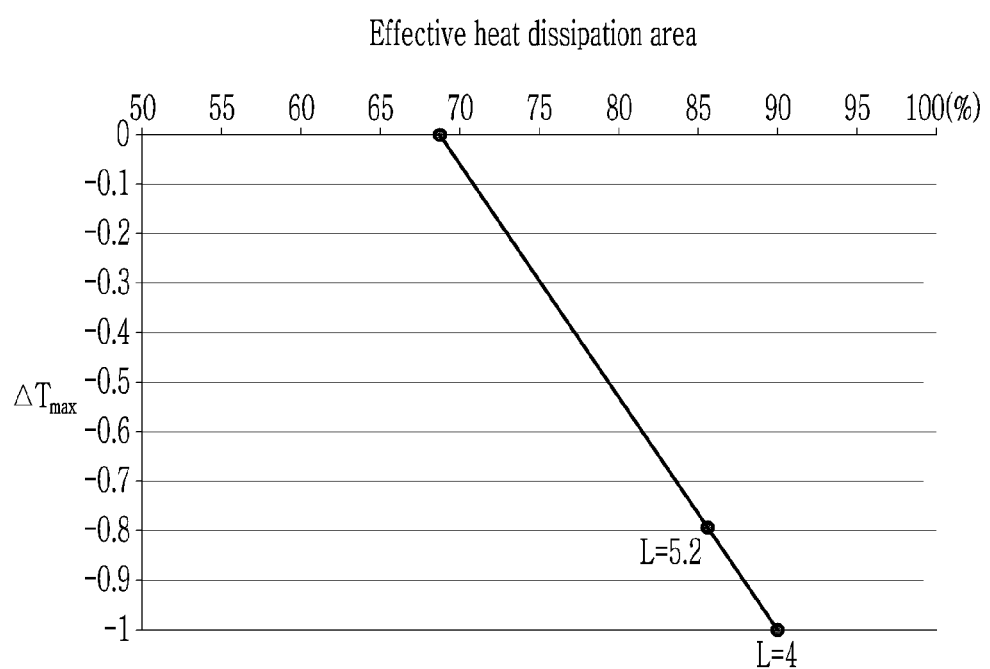
FIG. 14 is a graph that shows a relationship between openings and an effective heat dissipation area of embodiments of a heat dissipation member in a display device.

FIG. 14 is a graph that shows a relationship between the first openings OP1 and an effective heat dissipation area of embodiments of the heat dissipation member 330 in the display device 1.

Referring to FIG. 14, when an embodiment of the heat dissipation member 330 in which the long side length L of the first opening OP1 is 4 mm (point L=4 in FIG. 14) is provided, the maximum temperature (Tmax) of the display panel 20 was described to be about 1.05° C. lower ($\Delta$Tmax) as compared to an embodiment of the heat dissipation member 330 having an effective heat dissipation area of 67% (see the comparative example of Table 1 and data point in FIG. 14 at $\Delta$Tmax=0). When an embodiment of the heat dissipation member 330 in which the first opening OP1 has a long side length L of 5.2 mm (point L=5.2 in FIG. 14) was provided, the maximum temperature of the display panel 20 was decreased by about 0.79° C. as compared to an embodiment of the heat dissipation member 330 having an effective heat dissipation area of 67%. The decrease of about 0.79° C. where the heat dissipation member 330 having the length L of the long side of the first opening OP1 is 5.2 mm was provided, is about 80% of the decrease of about 1.05° C. where the heat dissipation member 330 having the length L of the long side of the first opening OP1 is 4 mm was provided.

The experiment results described with reference to FIG. 12 to FIG. 14 support a range of lengths L of the long sides of the first opening OP1 defined by the above equation $(0.3 \times (A-B_1-B_2)/C < L < 0.5 \times (A-B_1-B_2)/C)$.

Hereinafter, a configuration of a display panel 20 that may be included in a display device 1 will be described with reference to FIG. 15.

Figure 15:
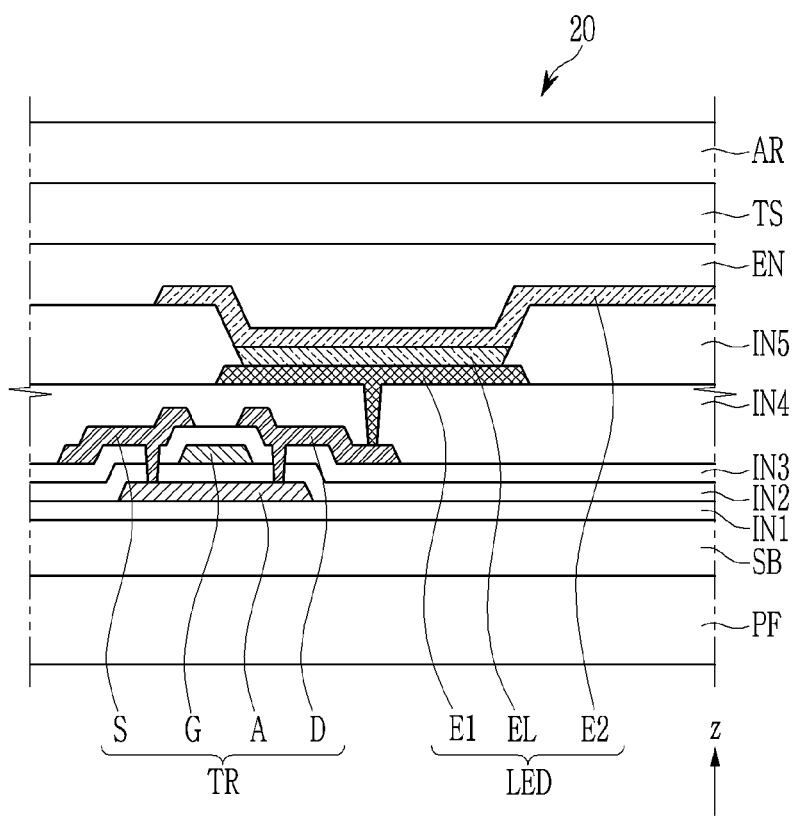
FIG. 15 is an enlarged cross-sectional view of an embodiment of a display panel.

FIG. 15 is an enlarged cross-sectional view of an embodiment of a display panel 20. FIG. 15 is a cross-sectional view provided for description of a stacked structure of the display panel 20 according to the embodiment. The cross-section shown in FIG. 15 may correspond to about one pixel area of the display panel 20. The display panel 20 may include the pixel area provided in plurality. Light may be generated and/or emitted, an image may be displayed, etc., at the pixel area of the display panel 20.

The display panel 20 may include a substrate SB, a transistor TR on the substrate SB, and a light emitting element such as a light emitting diode LED connected to the transistor TR.

The substrate SB may be a flexible substrate including a polymer such as polyimide ("PI"), polyamide ("PA"), and polyethylene terephthalate ("PET"). The substrate SB may include a barrier layer that reduced or effectively prevents penetration of moisture, oxygen, and the like to other layers of the display panel 20 from outside thereof. In an embodiment, for example, the substrate SB may include at least one polymer layer and at least one barrier layer, and the polymer layer and the barrier layer may be alternately stacked along the thickness direction (e.g., third direction z).

A first insulation layer IN1 may be disposed on the substrate SB. The first insulation layer IN1 may be referred to as a buffer layer, and may block an impurity that may be diffused from the substrate SB to a semiconductor layer A of the transistor TR and reduce the stress applied to the substrate SB in a process of providing or forming the semiconductor layer A. The barrier layer and the first insulation layer IN1 may include an inorganic insulation material such as a silicon oxide, a silicon nitride, and the like.

The semiconductor layer A of the transistor TR may be disposed on the first insulation layer IN1, and a second insulation layer IN2 may be disposed on the semiconductor layer A. The semiconductor layer A may include a source region, a drain region, and a channel region disposed between the source region and the drain region. The semiconductor layer A may include a semiconductor material such as polysilicon, an oxide semiconductor, amorphous silicon, and the like. The second insulation layer IN2 may be referred to a gate insulation layer, and may include an inorganic insulation material.

A gate conductor including a gate electrode G of the transistor TR may be disposed on the second insulation layer IN2. The gate conductor may include molybdenum (Mo), copper (Cu), aluminum (Al), silver (Ag), chromium (Cr), tantalum (Ta), titanium (Ti), and the like.

A third insulation layer IN3 may be disposed on the gate conductor. The third insulation layer IN3 may be referred to as an interlayer insulation layer, and may include an inorganic insulation material.

A data conductor that includes a source electrode S and a drain electrode D of the transistor TR may be disposed on the third insulation layer IN3. The source electrode S and the drain electrode D may be respectively connected with a source region and a drain region of the semiconductor layer A at or through contact holes provided or formed in the third insulation layer IN3 and the second insulation layer IN2. The data conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like.

A fourth insulation layer IN4 may be disposed on the data conductor. The fourth insulation layer IN4 may be referred to as a passivation layer or a planarization layer, and may include an organic insulation material.

A first electrode E1 of the light emitting element may be disposed on the fourth insulation layer IN4. The first electrode E1 may be referred to as a pixel electrode. The first electrode E1 may be connected with the drain electrode D at or through a contact hole provided or formed in the fourth insulation layer IN4.

A fifth insulation layer IN5 may be disposed on the fourth insulation layer IN4. The fifth insulation layer IN5 may be referred to as a pixel definition layer, and may defined or include an opening therein that corresponds to the first electrode E1. An emission layer EL of the light emitting element may be disposed over the first electrode E1 in the opening of the fifth insulation layer IN5, and a second electrode E2 may be disposed on the emission layer EL. The second electrode E2 may be referred to as a common electrode CE.

The first electrode E1, the emission layer EL, and the second electrode E2 may form a light emitting diode LED, which may be an organic light emitting diode LED. The first electrode E1 may be an anode of the light emitting diode LED, and the second electrode E2 may be a cathode of the light emitting diode LED.

An encapsulation layer EN may be disposed on the second electrode E2. The encapsulation layer EN may reduce or effectively prevent permeation of external moisture or oxygen by encapsulating the light emitting diode LED. The encapsulation layer EN may include one or more organic material layers and one or more organic material layers, and the inorganic material layer and the organic material layer may be alternately stacked. A capping layer and/or a function layer may be disposed between the second electrode E2 and the encapsulation layer EN.

A touch sensor layer TS may be disposed on the encapsulation layer EN. The touch sensor layer TS may include touch electrodes including or formed of a transparent conductive material such as indium tin oxide ("ITO"), indium zinc oxide ("IZO"), and the like, a metal mesh, and the like, and the touch electrodes may include a single layer or multiple layers. The touch sensor layer TS may be provided or formed directly on the encapsulation layer EN, or may be separately provided or formed and then attached on the encapsulation layer EN.

An anti-reflection layer AR may be disposed on the touch sensor layer TS to reduce reflection of external light incident to the display panel 20 from outside thereof. The anti-reflection layer AR may include a polarizer. Instead of providing or forming the anti-reflection layer AR, the encapsulation layer EN and/or touch sensor layer TS as separate layers, such layers may be provided or formed in a collective refractive index matching structure to obtain an anti-reflection effect.

The anti-reflection layer AR or the collective refractive index matching structure may define a top surface of the display panel 20, without being limited thereto A protective film PF may be disposed below the substrate SB to protect the display panel 20. The protective film PF may define a bottom surface of the display panel 20, without being limited thereto.

Referring to FIG. 1, the window 10 may be bonded to the top surface of the display panel 20 by the adhesive layer 41, and the cover panel 30 may be bonded to the bottom surface of the display panel 20 by the adhesive layer 42.

While the invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:
1. A display device comprising:
a cover panel including a heat dissipation member which is bent, the heat dissipation member comprising:
a flat portion defining a plurality of first openings having a number of first openings,
a bent portion which extends bent from the flat portion along a first direction and defining a plurality of second openings having a number of second openings, and
the number of first openings within the flat portion being smaller than the number of second openings within the bent portion, and
a display panel which faces the flat portion and the bent portion of the heat dissipation member in which the bonding length in the flat portion is greater than the bonding length in the bent portion.

2. The display device of claim 1, wherein the heat dissipation member comprises graphite.

3. The display device of claim 1, wherein the heat dissipation member further comprises within the flat portion:
the plurality of first openings including a first opening which has a shape of a rectangle defined by a long side and a short side,
a length of the short side of the first opening is smaller than a length of the long side thereof, and
the length of the long side of the first opening extends along the first direction.

4. The display device of claim 3, wherein
the display panel has a long side and a short side, a length of the short side of the display panel being smaller than a length of the long side thereof, and
the long side of the first opening is perpendicular to the long side of the display panel.

5. The display device of claim 3, wherein the cover panel further comprises:
the bent portion provided in plural including a first bent portion and a second bent portion at opposing sides of the flat portion, along the first direction,
the heat dissipation member comprising the plurality of first openings provided in plural arranged along the first direction, and
the length of the long side of the first opening satisfying the equation:

$$0.3 \times (A - B_1 - B_2)/C < L < 0.5 \times (A - B_1 - B_2)/C,$$

where L denotes the length of the long side of the first opening, A denotes a short side direction length of the cover panel along the first direction, $B_1$ denotes a short side direction length of the first bent portion along the first direction, $B_2$ denotes a short side direction length of the second bent portion along the first direction, and C denotes a number of the plurality of first openings which are arranged along the first direction.

6. The display device of claim 3, wherein the heat dissipation member further comprises:
the plurality of second openings including a second opening which is in the bent portion and has a length along the first direction, and
a sum of a total planar area of the plurality of first openings and a total planar area of the plurality of second openings less than about 15% of a total planar area of the heat dissipation member.

7. The display device of claim 3, wherein the heat dissipation member further comprises:
the plurality of second openings including a second opening which is in the bent portion and has a square shape of which a length of one side thereof is about 1 millimeter or less.

8. The display device of claim 7, wherein
the display panel has a long side and a short side, a length of the short side being smaller than a length of the long side, and
each side of the square shape of the second opening is perpendicular to or parallel with the long side of the display panel.

9. The display device of claim 3, wherein
the cover panel further comprises a first adhesive layer on a first side of the heat dissipation member which faces the display panel, and a second adhesive layer on a second side of the heat dissipation member which is opposite to the first side thereof,
the plurality of second openings including a second opening which has a length along the first direction, and
the first adhesive layer and the second adhesive layer are connected to each other at each of the first opening and the second opening.

10. The display device of claim 9, wherein the cover panel further comprises a shield layer attached to the heat dissipation member by the first adhesive layer.

11. The display device of claim 10, wherein the cover panel further comprises an impact absorption layer attached to the heat dissipation member by the second adhesive layer.

12. The display device of claim 1, wherein the heat dissipation member further comprises:
the plurality of second openings including a second opening which is in the bent portion and has a length along the first direction, and
a total planar area of the plurality of second openings is about 5% to about 20% of a total planar area of the bent portion of the heat dissipation member.

13. The display device of claim 1, wherein
an outer edge of the heat dissipation member corresponds to an outer edge of the display panel, and
the outer edge of the heat dissipation member is spaced apart from the outer edge of the display panel by about 0.1 millimeter to about 0.5 millimeter.

14. The display device of claim 1, wherein the cover panel faces a rear side of the display panel,
further comprising a window which faces a front side of the display panel which is opposite to the rear side thereof.

15. A display device comprising:
a heat dissipation member which is bent comprising:
a flat portion defining a plurality of first openings having a number of first openings,
a bent portion which extends bent from the flat portion along a first direction and defining a plurality of second openings having a number of second openings, and
the number of first openings within the flat portion being smaller than the number of second openings within the bent portion, and
a display panel facing the heat dissipation member, the display panel comprising:
a long side and a short side, and
a length of the short side which is parallel to the first direction in which the bent portion of the heat dissipation member extends bent from the flat portion thereof and smaller than a length of the long side.

16. The display device of claim 15, wherein the heat dissipation member further comprises:
each of the plurality of first openings defined by a long side along the first direction and a short side, a length of the short side being smaller than a length of the long side thereof, and
each of the plurality of second openings having a length along the first direction.

17. The display device of claim 16, further comprising a first adhesive layer in contact with a first side of the heat dissipation member which faces the display panel, and a second adhesive layer in contact with a second side of the heat dissipation member which is opposite to the first side thereof,
wherein the first adhesive layer and the second adhesive layer are connected to each other at each of the plurality of first openings and the plurality of second openings.

18. The display device of claim 17, further comprising a shield layer attached to the heat dissipation member by the first adhesive layer or the second adhesive layer,
wherein the shield layer comprises a metal.

19. The display device of claim 15, wherein the heat dissipation member further comprises a carbon material.

20. The display device of claim 15, further comprising a cover panel comprising:
- the heat dissipation member,
- a flat area corresponding to the flat portion of the heat dissipation member,
- a first bended area and a second bended area at opposing sides of the flat area of the cover panel, along the first direction, each of the first bended area and the second bended area of the cover panel corresponding to the bent portion of the heat dissipation member, and
- a length of the first side of the first openings satisfying the equation:

$$0.3 \times (A-B_1-B_2)/C < L < 0.5 \times (A-B_1-B_2)/C,$$

where L denotes the length of the first side of the first openings, A denotes a short side direction length of the cover panel along the first direction, $B_1$ denotes a short side direction length of the first bended area along the first direction, $B_2$ denotes a short side direction length of the second bended area along the first direction, and C denotes a number of the first openings arranged along the first direction.

* * * * *